United States Patent
Raber (10) Patent No.: US 7,791,351 B2
(45) Date of Patent: Sep. 7, 2010

(54) METHOD FOR DETECTING ELECTRICAL GROUND FAULTS

(76) Inventor: Monte B Raber, #6-715 Lanark Street, Winnipeg, Manitoba (CA) R3N 1M4

(*) Notice: Subject to any disclaimer, the term of this patent is extended or adjusted under 35 U.S.C. 154(b) by 217 days.

(21) Appl. No.: 11/889,088

(22) Filed: Aug. 9, 2007

(65) Prior Publication Data

US 2008/0036466 A1 Feb. 14, 2008

Related U.S. Application Data

(60) Provisional application No. 60/836,950, filed on Aug. 11, 2006.

(51) Int. Cl.
*G01R 31/14* (2006.01)
*H02H 3/00* (2006.01)
*H02H 9/08* (2006.01)
(52) U.S. Cl. .............. 324/509; 361/78; 361/42
(58) Field of Classification Search .......... 324/509; 361/78
See application file for complete search history.

(56) References Cited

U.S. PATENT DOCUMENTS

| | | | | |
|---|---|---|---|---|
| 5,764,462 | A * | 6/1998 | Tanaka et al. ............ | 361/42 |
| 6,812,396 | B2 * | 11/2004 | Makita et al. ............ | 136/244 |
| 7,400,476 | B1 * | 7/2008 | Hull, Jr. .................. | 361/42 |
| 2005/0259373 | A1 * | 11/2005 | Hoopes .................... | 361/90 |

FOREIGN PATENT DOCUMENTS

EP 1306682 5/2003

OTHER PUBLICATIONS

Hertert Testing for Neutral-to-Ground Connections in New Construction J. Clinical Engineering, May/Jun. 1991, vol. 16 No. 3 pp. 207-214.
Power Quality Trouble Shooting 9/98 B033UEN 1998 1266009_a_w.pdf at Fluke.com webpage, 5, 6,9, 31.
Michaels Ten Easy Steps for Testing Branch Circuits EC&M Jan. 1999 pp. 16 and 18, original www. ecm.web, copy supplied from ECM internet.
Jowett Ac loop impedance testing EC&M Jan. 1999 2 pages copy supplied from ceenews.com/mag/electric_ac_loop_impedance.
Electrical Tech Note—102 Agricultural Engineering Department, Michigan State University, Mar. 2004, 5 pages.
Basic electrical installation testing. Fluke Corporation, 2003, 3 pages.
SureTest Circuit Analyzer Instruction Manual for 61-164/165, Ideal Industries Inc., Sycamore IL Nov. 2006 15 pages.

* cited by examiner

*Primary Examiner*—Jeff Natalini (57) ABSTRACT

A method of testing live AC circuits for neutral-ground, neutral-isolated ground, and isolated ground-ground faults, involves measuring impedances of circuit portions, including hot-neutral, neutral-ground, neutral-ground and isolated ground loops. In general either a test current generating a driving voltage is used, or in the case of hot-neutral, a load current generating a load voltage, and the voltage without current are use to measure voltage drop. These voltages are proportionate to the impedances of the circuits, which are expressed as ratios indicating the presence of faults. The method is reliable, despite much variation in circuit characteristics, including oversized neutral, shared neutral same phase, shared neutral opposed phase, supply line impedance, and high impedance grounds, it is easily able to detect faults across conductors and shared neutral loads.

3 Claims, 6 Drawing Sheets

BRANCH CIRCUITS - NORMAL CONDITIONS

Fig. 1

SOLIDLY GROUNDED BRANCH CIRCUIT

Fig. 2

IG - ISOLATED GROUND BRANCH CIRCUIT

BRANCH CIRCUITS WITH N - G and IG - G FAULTS

Fig. 3  SOLIDLY GROUNDED BRANCH CIRCUIT
WITH NEUTRAL TO GROUND FAULT

Fig. 4  IG - ISOLATED GROUND BRANCH CIRCUIT
WITH NEUTRAL AND GROUND FAULTS

Fig. 5   Shared Neutral Configurations

Fig. 6 Block Diagram of Method to Derive Ratio α to Detect Neutral to Ground Faults

Substitute IG for G to detect Neutral to Isolated Ground Faults

Fig. 7 Block Diagram of Method to Derive Ratio ß to Detect Neutral to Ground Faults Substitute IG for G to detect Neutral to Isolated Ground Faults Fig. 8      Block Diagram of Method to Derive Ratio Ø
to Detect Isolated Ground to Ground Faults

METHOD FOR DETECTING ELECTRICAL GROUND FAULTS

This application claims priority of U.S. provisional patent application No. 60/836,950, Method and tester for electrical ground faults, to Monte B. Raber, filed 11 Aug. 2006.

This invention is directed to methods of detecting electrical ground faults and other interfering circuit conditions in live circuits. Generally ratios of voltage drops of circuit portions are measured, which are indicative of circuit fault status.

As used in this application "ground" alone means safety or normal ground throughout this application. "Isolated ground" means isolated ground throughout this application, isolated ground is often called insulated ground. As used in this application "neutral conductor" refers to both an intact neutral conductor in the absence of faults, and as it appears to be in the presence of faults. "Receptacle" as used herein is interchangeable with "outlet."

BACKGROUND

The basic problem is neutral-ground, neutral-isolated ground and isolated ground-ground faults. In all circuits there can be neutral-ground faults, when isolated ground is present, there can also be neutral-isolated ground and isolated ground-ground faults. Hot-neutral and hot-ground faults are far more easily detected than neutral-ground, neutral-isolated ground, and isolated ground-ground faults, since current will usually trip circuit breakers or similar protective devices. Neutral and ground (and isolated ground, when present) should only be connected by the ground bond at the transformer or source panel in theory according to electrical codes. Ground conductors are not intended to carry load currents, while neutral conductors are. Once electric circuits are installed the only present effective method of testing for neutral-ground, neutral-isolated ground and isolated ground-ground faults is disconnecting part or all of a circuit and testing it bit by bit, first to detect neutral-ground, neutral-isolated ground, and isolated ground-ground faults and then to locate them. This is time consuming, so expensive, needing at least an apprentice electrician, and requires disconnecting initially all, then parts of an electrical system downstream of a transformer or other power source. Such a system can cover part of a floor, a floor, a building, a block, sometimes more. Such interruption is unacceptable to users of the system in any event, and impossible with computer systems, computer controlled systems and most medical equipment, however necessary checking the system for faults may in fact be.

Ground is always used to provide a low impedance path to the earthed point of the supply in case of a hot or neutral conductor fault. It may also be used to provide a zero-voltage low impedance ground reference or noise free background for sensitive instruments, such as computers and the like. When there is a neutral-ground fault, current flows in the ground conductor compromising the zero-voltage reference function. Two ground conductors are often present, the low impedance path to ground is provided by a safety ground conductor, while the zero-voltage reference is provided by an isolated ground conductor. Both ground conductors are joined to the neutral at the electrical source of the system, the transformer, and there connected to ground or preferably directly to earth.

Generally the isolated ground conductor is used as a quiet ground reference for equipment, insulated from the ordinary grounded parts of the circuit, and is not designed as a safety ground. If the isolated ground conductor is accidentally connected to ground at a receptacle, outlet or in equipment, the features of the isolated ground circuit are lost to the whole system. There are no overt indications of a ground-isolated ground fault or contact. Both ground and isolated ground (and indeed neutral) conductors are bonded together at the source of the electrical service and connected to earth at that point, it is difficult to detect an improper connection (or fault).

Isolated ground or neutral to ground faults typically occur in wiring boxes where the neutral or isolated ground conductor inadvertently makes a connection with another conductor. Most frequently, this fault can occur through slicing of conductor insulation, or local compression from a mounting screw or receptacle ground strap, or improper placing of the bare safety bonding conductor. Less frequently the fault may be caused by a nail or screw puncture of the conduit or cable, or a rough point in a conduit. The fault can occur over a period of time by cold flow through the insulation at the point under pressure, so that failure may occur in circuits after they have been put in service, as well as at the time of construction. Another cause is improper connections between equipments so the isolated ground of one equipment is connected to ground of another equipment.

As discussed under prior art, circuit testing is necessarily performed at installation. The method of the invention can be incorporated with standard circuit testing at installation. Before about 1970 (pre-electronic) electrical equipment was not sensitive to power fluctuations. Electronically controlled equipment (solid state, digital, computers, etc.) caused the use of electricity to expand greatly, leading to variability of power demand, modified electrical supply and so to power quality problems. Now the switching of electric appliances "on/off" affects power quality in that general circuitry. Modern circuit design accommodates power quality. Power quality testing is essential, at installation and later, in many modern circuits and is meaningless in the presence of ground-neutral, isolated ground-neutral and isolated ground-ground faults, thus testing for such faults is a pre-requisite for power quality testing, and currently no comprehensive method exists. Both circuit and power quality testing are required for hospitals and similar institutions.

For instance an intact ground will usually have a voltage of less than 20 millivolts, in the presence of a neutral-ground fault the voltage may be from 2 to 10 volts. If that ground is connected to an intracardiac lead the higher voltage can be fatal.

The method of the invention can be used to find broken neutrals and grounds, neutral breaks are known and can be and are often catastrophic, in multi-phase systems the full current flow between phase hot lines can fry electrical equipment.

Maintenance of power quality is vital to operation of computer systems. UPS (Uninterrupted Power Supplies) are integral to most power systems involving computers for this reason. UPS vary through small power boxes with battery/transformer/power supply charger inverter converting battery supply to 60 Hertz, for computers up to big systems for radio or telephone systems, with their own generators. UPS are 99.9% reliable. Besides normal power failures, ground breaks and neutral breaks are common enough to warrant precautions against such failures.

All these facts indicate that power circuits require live testing at installation for circuit integrity and power quality, as well as later live testing to find faults. At present there is no method to do this.

PRIOR ART

At present there is no simple accurate method to check for the integrity of an isolated ground conductor in a powered branch circuit. The best present method is to disconnect the branch circuit conductors at the branch distribution panel and downstream connection points, measuring with an ohmmeter or insulation tester, then properly reconnecting the conductors. This method is time consuming, requires shutting off the power at the panel, imposes a safety risk, and requires a licensed electrician.

Several methods and instruments provide limited accuracy to detect such faults. The voltage on the isolated ground may be measured with respect to another grounded point. Another method is to impose a current through a load resistor from the hot line to isolated ground and separately to ground and measure the voltage (or impedance) of each ground conductor. If the voltage on the isolated ground is greater than the voltage on the ground then isolation is considered intact. An improper connection is suspected if voltage or resistance (impedance) is too small or too large—but these indications are just a matter of judgement. These methods suffer from lack of specificity, since they may erroneously indicate such a connection when conductor length to the distribution panel is short, or when the circuit is enclosed in non-metallic conduit. These methods may involve applying the 120 volt line voltage to the ground circuit under test through a load, and so are not permitted in patient care areas of health care facilities.

Dozens of testing methods exist. An exhaustive method of testing for neutral-ground faults in newly constructed circuits is discussed by Hertert et al., Journal of Clinical Engineering, Vol. 16, No. 3, May-June 1991, pp. 207-214. The method is only practical before installing patients and equipment, involving disconnecting the system bit by bit, and measuring neutral-ground impedance as resistance downstream. Low resistance other than hundreds of kilo-ohms indicated a fault, those found were largely improper neutral-ground connections, some were damaged insulation and the like. The authors admit that locating faults as opposed to detecting faults, requires shutting down all or part of an electrical system, which may be impossible. Power Quality Trouble Shooting at Fluke (9/98 B033UEN 1998 1266009_a_w.pdf at Fluke.COM webpage 5-9 and 31) discusses the relationship between L-N (line-neutral) and N-G (neutral-ground) voltages in a loaded circuit. L-N may be below nominal for several reasons, such as panel feeder voltage is low, or the circuit is overloaded. Direct checking at the panel is difficult and inconvenient. N-G voltage is more easily checkable, in theory the G conductor has no current and thus zero voltage drop, so measuring the N-G voltage gives the effective N voltage. In general Fluke suggests low receptacle N-G voltage say 2 to 5 volts is OK, lower around 0 volts suggests a N-G fault, higher suggests a shared N conductor either between receptacles or between phases, possibly with third harmonics, and may indicate other problems. Fluke lists a number of potential power quality circuit distortions ranging from neutral conductors inadequate to carry third harmonics, absence of ground conductors, shared neutrals, ground connected to neutral and neutral correspondingly connected to ground, isolated ground rods, ground and neutral connected by accident, which does not include the usual faults from gross wiring error, or from inadvertent connections from bare insulation, nails, screws, wires crammed into receptacle boxes, etc. All these either put more current into, and voltage across neutral conductors, than expected, or current into and voltage across ground conductors, in either event distorting L-N and N-G voltages. As Fluke admits there's plenty of room for judgment, and rules of thumb are indicative at best rather than diagnostic, if that. Michaels, Ten Easy Steps for Testing Branch Circuits, EC&M, January 1999, www.ecmweb.com pp. 16 and 18, states L-N should be 120 VAC, L-G 120 VAC and N-G 0 VAC, and in any event not more than ½ VAC. He states that N-G faults can be detected within 20 feet of a receptacle, although how is not stated. Jowett EC&M, 1 Jan. 1999 discusses AC impedance loop testing for ground circuits which may have faults. Calculation of ground circuit or loop impedance is difficult since the neutral circuit is connected to the ground circuit at the source bond, and is rarely properly carried out, and besides as shown above, electrical errors and faults abound. Jowett recommends direct loop impedance measurement using a loop impedance tester, which simulates a fault L-G and L-N. The unloaded voltage ($V_S$) is first measured farthest from the supply, then a known resistance (R) is connected across conductors and voltage drop across the load ($V_R$) measured. The residual impedance of the loop ($R_{loop}$) is calculated from unloaded voltage and voltage drop across the load [for the arithmetically inclined $R_{Loop}=R*\{(V_S-V_R)/V_R\}$], using two half cycles of AC current, 16 milliseconds at 60 Hz, 20 milliseconds at 50 Hz, which is insufficient time to trip circuit breakers and similar protective devices. Loop impedance $R_{loop}$ must be sufficiently small to pass a current large enough to trip circuit breakers or other protective devices in case of a fault from hot to ground. An obvious corollary test is PSCC (prospective short circuit current) maximum short circuit current from supply measured by loop impedance tester, no details given by Jowett, and used to set protective device size, so that they are not sacrificed in use. Electrical Tech Note 102, Electrical Engineering Department, Michigan State University, teaches practical panel tests for neutral-ground tests. In the panel the main and all circuit breakers are turned off. In a three wire single phase service the neutral circuit wire is disconnected from the joint neutral and ground bus, and reconnected through a continuity tester, if continuity is shown, a neutral-ground fault is present, associated with the circuit containing that neutral wire. In a four wire three phase system there are separate ground and neutral buses at the panel. The main breaker is on and all circuit breakers are turned off. A voltmeter is connected across the neutral and ground buses, which should read zero or nearly zero. Then one circuit breaker with a load device is turned on, the voltmeter should change noticeably, if it doesn't there's a neutral-ground fault. As a check the voltmeter can be connected between the separate neutral bus and an outside reference ground, if no voltmeter change with circuit breaker change then there's a neutral-ground fault. Another check is to connect separate ground bus and outside reference ground, if same voltmeter reading as outside ground and separate neutral bus then there's a neutral-ground fault. To check circuit by circuit, the circuit neutral wire is disconnected from the separate neutral bus, and reconnected to the separate ground bus through a continuity tester. If continuity is shown a ground-neutral fault is present in that circuit. This procedure is a simplified version of Hertert for an existing system in use, the note observes since the system is live, the method should be conducted by a skilled individual. Suretest® circuit analyzer plugs into outlets and measures mean and peak L voltage and frequency, obviously departures from standard can indicate problems. It also measures L-N voltage drop at 12 amp load for a 12 amp circuit, at 15 amp load for a 15 amp circuit, at 20 amp load for a 20 amp circuit, the voltage drops are calculated, and then indicated as within 5% satisfactory or greater unsatisfactory. Ground-neutral voltage is measured—less than 2 volts is satisfactory, more unsatisfactory. Impedance is measured for line, neutral and ground, the last by pulse from line to ground. The results are interpreted in maximum ohms/foot of wire (which requires knowledge of wire lengths) 0.48 (14 gauge), 0.03 (12 gauge), 0.01 (10 gauge) for L and N, and maximum ohms for G, 1 for personnel protection, 0.25 for equipment protection; these values are arbitrary, and do not apply in every case.

Fluke in Application Note on Basic electrical installation testing describes use of testing device Fluke 1650, in compliance with IEC 60364 (6.61) specifying tests and EN 61557 specifying test equipment requirements, that is to the European standard. Visual inspection by properly qualified personnel is followed by continuity testing of protective conductors using no-load voltage 4 to 24 V (DC or AC) generating a minimum 0.2 A current. The resistance of all protective conductors are measured, their continuity confirmed and then testing main and supplementary equipotential bonding conductors, then all circuit conductors in the final circuit. Then the insulation integrity is checked between live conductors and earth. The entire installation is switched off, all lamps removed and all equipment disconnected. Fuses are left in, circuit breakers and all final switches closed. Test voltages of 1000, 500 and 250 V are applied, observed resistances should be greater than 1 megohm, 0.5 megohm, and 0.25 megohm respectively to pass the test. Separation of live circuit parts is then tested with all equipment connected, and insulation resistance measured again, with the same requirements as before. Wall and floor resistance is tested with no-load voltages of 500 or 1000 V DC. Automatic disconnection of supply is also tested in TN systems by measuring fault loop impedance and verifying associated protective devices; in TT systems by measuring earth electrode resistance for exposed conductive parts and also verifying associated protective devices; in IT systems by calculation or measurement of fault current. The fault loop impedance is measured as discussed above as is the fault current (no details given). The earth electrode resistance measures voltage between the installation earth rod and test electrodes which must be less than 10 V. The protective devices are tested by determining the tripping time in milliseconds for appropriate currents. Switch polarities are checked by using continuity testers. Finally assemblies are tested for correct installation mounting and adjustment. As can be seen this is far more rigorous than current North American standards. In a companion Fluke Application note on the importance of loop impedance testing, its value is stressed. Apparently $R_{loop}$ is calculated as above, and using this value the PSC (prospective short circuit current) and PFC (prospective fault current) are calculated without details being given of how and what.

European Patent 1306682 published 2 May 2003, describes a method of, and device for, measuring the characteristics of a mains circuit without tripping a RCD—note "ground" is replaced by "earth" throughout. The L-N and N-G voltages are measured in an unloaded state. A load resistance to generate a high current is connected line to neutral, and the L-N and N-G voltages measured. The test current is calculated for the loaded state, and the voltages divided by test currents to give resistance of the L-N loop, and N conductor calculated. Passing a low DC current into the N-G loop and measuring voltage change to calculate N-G resistance. Determining L-G resistance by sum of line conductor resistance and ground conductor resistance, derived from above data.

None of the above methods gives a clear and effective method of detecting and locating neutral-ground faults, in a system in electrical operation. Existing methods rely on the investigators' (electricians and electrical engineers) experience and familiarity with practical wiring problems (mainly, though not exclusively, due to inadvertence, mistake, and errors of omission and commission). There is thus an analysis gap despite the efforts to test and provide data, which neither detects nor locates the common neutral-ground faults. There is therefore a need for such a method.

Comparison of N-G Fault Detection Methods

Some authors advocate judging the Neutral to Ground (N-G) voltage $V_{NG}$ under load as a measure of a N-G fault. This method is suitable only if there is a N-G fault immediately at the receptacle under test—then the N-G voltage is virtually zero. Otherwise, if the N-G fault is some distance from the receptacle under test, then the N-G voltage is a function of circuit length, conductor size, load current; and judging by any arbitrary value of voltage is useless, particularly for short circuit lengths with low values of voltage drop and conductor impedance.

The following table of measured values illustrates why just using the absolute value of Neutral-Ground voltage $V_{NG}$ is inadequate by comparison of N-G fault detection methods. The ratio in the table is $V_{NG}/V_{DROP}$, where $V_{DROP}=V_{OC}-V_L$, $V_{OC}$ is circuit voltage (hot-neutral) without current and $V_L$ is circuit voltage (hot-neutral) under load.

TABLE I

| Cct | Voltage Drop | N-G Voltage at 12 Ampere Load | Ratio | Condition of Circuit |
|---|---|---|---|---|
| 1 | 2.3% | 0.039 | .01 | N-G Fault immediately at receptacle |
| 2 | 2.2% | 0.381 | 0.15 | N-G fault halfway to distribution panel (about 30 feet to fault) |
| 2 | 3.0% | 1.772 | 0.5 | Circuit above after N-G fault found and repaired |
| 3 | 0.6% | 0.280 | 0.4 | Normal circuit of quite short length |
| 4 | 1.3% | 0.478 | 0.32 | Normal circuit of medium length |
| 5 | 3.7% | 2.038 | 0.49 | Normal circuit of longer length |

Ratio = $V_{NG}/V_{DROP}$. A Ratio value of less than about 0.3 is indicative of a N-G fault condition.
Circuit #1, with the N-G fault immediately at the receptacle under test, has a N-G voltage of almost zero, all others have greater values of N-G voltage.

Note that the voltage drop of circuit #2 increased from 2.2% to 3.0% after the N-G fault was found and repaired. This change is caused by the Neutral conductor resistance no longer being reduced by the parallel resistance of the ground conductor—thus the H-N loop resistance is now greater. Also, note that the Ratio increased from 0.15 to 0.5 after the N-G fault was repaired.

It is clear that the normal short length circuit (Cct 3—lowest voltage drop) has smaller N-G voltage than the circuit #2 with the fault, so a low value of N-G voltage is not an adequate measure of a fault condition.

OBJECTS OF THE INVENTION

The principal object of the invention is to provide a method of detecting faults in live circuits by comparing voltage drops across portions of the circuit, and expressing ratios of these voltage drops as indicative of faults. A further principal object of the invention is to provide a method of detecting faults in live circuits with alternating current by comparing voltage drops of portions of the circuit, and expressing ratios of these voltage drops as indicative of faults. A further principal object of the invention is to provide a method of detecting faults by passing electric currents between receptacle poles and measuring voltage drops caused by said electric currents, and expressing said voltage drops as a ratio to detect faults. A principal object of the invention is to provide a method to compare voltage drops in portions of the circuit selected from the group consisting of neutral-ground loop, and hot-neutral loop, neutral-isolated ground loop, isolated ground-ground loop, neutral conductor, ground conductor and isolated ground conductor. A subsidiary object of the invention is to compare voltage drops wherein said portions of said circuit compared are the hot-neutral loop and neutral-ground loop. A subsidiary object of the invention is to compare voltage drops wherein said portions of said circuit compared are the hot-neutral loop and neutral-isolated ground loop. A subsidiary object of the invention is to compare voltage drops wherein said portions of said circuit compared are the hot-neutral loop and the neutral conductor. A subsidiary object of the invention is to measure the hot-neutral voltage when no current is flowing, and also measure the hot-neutral voltage when a load current is flowing, when this load current is flowing the neutral-ground voltage is measured, which is then compared to the difference between the no current voltage and the load voltage, and expressed as a ratio, to detect neutral-ground faults. Another subsidiary object of the invention is to measure the hot-neutral voltage when no current is flowing, and also measure the hot-neutral voltage when a load current is flowing, when this load current is flowing the neutral-isolated ground voltage is measured, which is then compared to the difference between the no current voltage and the load voltage, and expressed as a ratio, to detect neutral-isolated ground faults. A further subsidiary object of the invention is to pass a test current between neutral and isolated ground poles to produce a first driving voltage, and also pass a test current between isolated ground and ground poles to produce a second driving voltage which is then compared to the first driving voltage and expressed as a ratio to detect isolated ground-ground faults. Another subsidiary object of the invention to measure the hot-neutral voltage when no current is flowing, and also measure the hot-neutral voltage when a load current is flowing, and then to pass a test current between neutral and ground poles to produce a driving voltage, which is then compared to the difference between the no current and load voltages and expressed as a ratio, to detect neutral-ground faults. A further subsidiary object of the invention is to measure the hot-neutral voltage when no current is flowing, and also measure the hot-neutral voltage when a load current is flowing, and pass a test current between neutral and isolated ground poles to produce a driving voltage, which is then compared to the difference between the no current and load voltages and expressed as a ratio, to detect neutral-isolated ground faults. Another subsidiary object of the invention is to measure the neutral-independent reference ground voltage when a load current is passed between hot and neutral poles, and pass a test current between neutral and ground poles to produce a driving voltage, which is then compared to the neutral-independent reference ground voltage and expressed as a ratio to detect neutral-ground faults. Yet another subsidiary object of the invention is to measure neutral-independent reference ground voltage when a load current is passed between hot and neutral poles, and pass a test current between neutral and isolated ground poles to produce a driving voltage, which is then compared to the neutral-independent reference ground voltage and expressed as a ratio to detect neutral-isolated ground faults. A subsidiary object of the invention is to pass an electrical load current between hot and neutral poles and measure the voltage between the neutral pole and independent reference ground and the voltage between the ground pole and independent reference ground which is then compared to the neutral to independent reference ground voltage caused by said load current and expressed as a ratio to detect neutral-ground faults. A subsidiary object of the invention is to pass an electrical load current between hot and neutral poles, and measure the voltage between the neutral pole and independent reference ground and the voltage between the isolated ground pole and independent reference ground which is then compared to the neutral to ground voltage caused by said load current expressed as a ratio to detect neutral-isolated ground faults. A subsidiary object of the invention is to measure the voltage without current between hot and neutral poles, the load voltage between hot and neutral poles while passing an electrical load current, and the voltage between ground and neutral poles is measured while passing a test current between hot and ground poles, which is then compared to the difference between voltage without current and load voltage, expressed as a ratio to detect neutral-ground faults. A subsidiary object of the invention is to measure the voltage without current between hot and neutral poles, the load voltage between hot and neutral poles while passing an electrical load current, and the voltage between isolated ground and neutral poles while passing a test current between hot and isolated ground poles, which is then compared to the difference between voltage without current and load voltage, expressed as a ratio to detect neutral-isolated ground faults. A subsidiary object of the invention is to measure the voltage between neutral and isolated ground poles and isolated ground and ground poles while passing a test current from hot to isolated ground poles and comparing the isolated ground to ground voltage to the neutral to isolated ground voltage expressed as a ratio to detect isolated ground-ground faults. A subsidiary object of the invention is to measure the voltage without current between hot and neutral poles, the load voltage between hot and neutral poles while passing an electrical load current, and the voltage between hot and ground poles while passing a test current between hot and ground poles, the difference between voltage without current and the voltage between hot and ground poles is then compared to the difference between voltage without current and load voltage, expressed as a ratio to detect isolated ground-ground faults. A subsidiary object of the invention is to measure the voltage without current between hot and neutral poles, the load voltage between hot and neutral poles while passing an electrical load current, and the voltage between hot and isolated ground poles while passing a test current between hot and isolated ground poles, the difference between the voltage without current and the voltage between hot and isolated ground poles is compared to the difference between voltage without current and load voltage, expressed as a ratio to detect isolated ground-ground faults. Other objects will be apparent to those skilled in the art from the following specification, accompanying drawings and appended claims.

DESCRIPTION OF THE INVENTION

In a broadest aspect the invention is directed to a method of detecting faults in live circuits by comparing voltage drops across portions of the circuit, and expressing ratios of these voltage drops as indicative of faults. In general the voltage drop is a measure of the impedance of a portion of the circuit. Preferably the live circuits are alternating current, but would apply to equivalent direct current circuits. Generally the voltage drops are generated by passing electric currents between receptacle poles and measuring voltage drops caused by the electric currents.

Preferably the portions of the circuit are selected from the group consisting of neutral-ground loop, and hot-neutral loop, neutral-isolated ground loop, isolated ground-ground loop, and neutral conductor, ground conductor and isolated ground conductor. The portions of the circuit compared may be the hot-neutral loop and neutral-ground loop. The portions of the circuit compared may be the hot-neutral loop and neutral-isolated ground loop. The portions of the circuit compared may be the hot-neutral loop and the neutral conductor.

In one broad aspect the method detects neutral-ground faults wherein the voltage without current $V_{OC}$ between the hot and neutral poles is measured, the load voltage $V_L$ between the hot and neutral poles is measured while passing an electrical load current, and the voltage between neutral and ground poles $V_{NG}$ caused by the electrical load current is measured and the neutral-ground voltage $V_{NG}$ divided by the difference between the voltage without current and the load voltage $V_{DROP} = V_{OC} - V_L$ is expressed as a ratio $V_{NG}/V_{DROP}$ indicative of neutral-ground faults. The difference between the voltage without current and the load voltage $V_{DROP}$ is proportionate to the impedance of the hot-neutral loop, while the neutral-ground voltage $V_{NG}$ is proportionate to the impedance of the neutral conductor, since there should be no current in the ground conductor. The expected ratio is 0.5. When there is a neutral-ground fault impedance and ratio are lowered.

In another broad aspect the method detects neutral-isolated ground faults wherein the voltage without current $V_{OC}$ between the hot and neutral poles is measured, the load voltage $V_L$ between the hot and neutral poles is measured while passing an electrical current, and the voltage between neutral and isolated ground poles $V_{NIG}$ caused by the electrical load current is measured and the neutral-isolated ground voltage $V_{NIG}$ divided by the difference between the voltage without current and the load voltage $V_{DROP}$ is expressed as a ratio $V_{NIG}/V_{DROP}$ indicative of neutral-isolated ground faults. As above the difference between no current and load voltages $V_{DROP}$ is proportionate to the hot-neutral impedance. The neutral-isolated ground voltage $V_{NIG}$ is proportionate to the impedance of the neutral conductor, since there should be no current in the isolated ground conductor. The expected ratio is 0.5. When there is a neutral-isolated ground fault impedance and ratio are lowered.

In a further broad aspect the method detects isolated ground-ground faults wherein the driving voltage to produce an electrical test current between neutral and isolated ground poles $V_{DRNIG}$ is measured, and the driving voltage to produce an electrical test current between isolated ground and ground poles $V_{DRIGG}$ is measured, and the driving voltage between isolated ground and ground poles divided by the driving voltage between neutral and isolated ground poles is expressed as a ratio $V_{DRIGG}/V_{DRNIG}$ indicative of isolated ground-ground faults. The driving voltage between neutral and isolated ground $V_{DRIGG}/V_{DRNIG}$ is proportionate to impedance of the neutral-isolated ground loop, while the driving voltage between isolated ground and ground $V_{DRIGG}/V_{DRNIG}$ is proportionate to the impedance of the isolated ground-ground loop. The expected ratio is 1. In the event of an isolated ground-ground fault, the impedance of the isolated ground-ground loop and the ratio are lowered.

In a further broad aspect the method detects neutral-ground faults, the voltage without current $V_{OC}$ between the hot and neutral poles is measured, and the load voltage $V_L$ between the hot and neutral poles while passing an electrical load current is measured, the driving voltage to produce a test current between neutral and ground poles $V_{DRNG}$ is measured, and the neutral to ground driving voltage divided by the difference between the voltage without current and the load voltage $V_{DROP}$ is expressed as a ratio $V_{DRNG}/V_{DROP}$ indicative of neutral-ground faults. As above the difference between no current and load voltages is $V_{DROP}$ proportionate to the impedance of the hot-neutral loop, while the driving voltage $V_{DRNG}$ is proportionate to the impedance of the neutral-ground loop. The expected ratio is 1, with faults lowering the impedance and ratio.

In a further broad aspect the method detects neutral-isolated ground faults, the voltage without current $V_{OC}$ between the hot and neutral poles is measured, and the load voltage $V_L$ between the hot and neutral poles passing an electrical load current is measured, and the driving voltage to produce a test current between neutral and isolated ground poles $V_{DRNIG}$ is measured, and the neutral to isolated ground driving voltage divided by the difference between the voltage without current and the load voltage $V_{DROP}$ is expressed as a ratio $V_{DRNIG}/V_{DROP}$ indicative of neutral-isolated ground faults. As above the difference between no current and load voltages $V_{DROP}$ is proportionate to the impedance of the hot-neutral loop, while the driving voltage $V_{DRNIG}$ is proportionate to the impedance of the neutral-isolated ground loop. The expected ratio is 1, with faults lowering the impedance and ratio.

In a further broad aspect, the method detects neutral-ground faults, wherein an electrical load current is passed between hot and neutral poles, and the voltage between the neutral pole and independent reference ground $V_{NR}$ by the electrical load current is measured and the driving voltage necessary to produce an electrical test current between neutral and ground poles $V_{DRNG}$ is measured, and the neutral to ground driving voltage divided by neutral to independent reference ground voltage caused by the load current is expressed as a ratio $V_{DRNG}/V_{NR}$ indicative of neutral-ground faults. The neutral-independent reference ground voltage $V_{NR}$ is proportionate to the impedance of the neutral conductor, while the driving voltage $V_{DRNG}$ is proportionate to the impedance of the neutral-ground loop. The expected ratio is 2, with faults lowering the impedance and ratio.

In a further broad aspect the method detects neutral-isolated ground faults, wherein an electrical load current is passed between hot and neutral poles, and the voltage between the neutral pole and independent reference ground $V_{NR}$ caused by the electrical load current is measured and the driving voltage necessary to produce an electrical test current between neutral and isolated ground poles $V_{DRNIG}$ is measured, and the neutral to isolated ground driving voltage divided by neutral to isolated ground voltage caused by the load current is expressed as a ratio $V_{DRNIG}/V_{NR}$ indicative of neutral-isolated ground faults. The neutral-independent reference ground voltage $V_{NR}$ is proportionate to the impedance of the neutral conductor, while the driving voltage $V_{DRNIG}$ is proportionate to the impedance of the neutral-isolated ground loop. The expected ratio is 2, with faults lowering the impedance and ratio.

In a further broad aspect the method detects neutral ground faults, wherein an electrical load current is passed between hot and neutral poles, and the voltage between the neutral pole and independent reference ground $V_{NR}$ caused by said electrical load current is measured, and the voltage between the ground pole and independent reference ground $V_{GR}$ measured and expressing the ground to independent reference ground pole voltage divided by neutral to ground voltage caused by said load current as a ratio $V_{GR}/V_{NR}$ indicative of neutral-ground faults. The neutral-independent reference ground voltage $V_{NR}$ is proportionate to the impedance of the neutral conductor, while the independent reference ground-ground voltage $V_{GR}$ should be zero, or negligible. The expected ratio is 0, with faults raising the ratio. The absolute independent reference ground-ground voltage $V_{GR}$ can also be used as a fault indicator.

In a further broad aspect the method detects neutral-isolated ground faults, wherein an electrical load current is passed between hot and neutral poles, and the voltage between the neutral pole and independent reference ground $V_{NR}$ caused by said electrical load current is measured, and the voltage between the isolated ground pole and an independent reference ground pole $V_{IGR}$ is measured and expressing the isolated ground to independent reference ground pole voltage divided by neutral to ground voltage caused by said load current as a ratio $V_{IGR}/V_{NR}$ indicative of neutral-isolated ground faults. The neutral-independent reference ground voltage $V_{NR}$ is proportionate to the impedance of the neutral conductor, while the independent reference ground-isolated ground voltage $V_{IGR}$ should be zero, or negligible. The expected ratio is 0 with faults raising the ratio. The absolute independent reference ground-isolated ground voltage $V_{IGR}$ can also be used as a fault indicator.

In a further broad aspect the method detects neutral-ground faults wherein the voltage without current $V_{OC}$ between hot and neutral poles is measured, the load voltage $V_L$ between hot and neutral poles is measured while passing an electrical load current, and the voltage between ground and neutral poles $V_{GN}$ is measured while passing a test current between hot and ground poles, and expressing the voltage between ground and neutral poles while said test current is passed divided by the difference between voltage without current and load voltage $V_{DROP}$, as a ratio $V_{GN}/V_{DROP}$ indicative of neutral-ground faults. The ground neutral voltage $V_{GN}$ is proportional to the ground conductor impedance, the difference between voltage without current and load voltage $V_{DROP}$ is proportional to the hot neutral loop impedance. The expected ratio is 0.5, with faults lowering impedance and ratio.

In a further broad aspect the method detects neutral-isolated ground faults wherein the voltage without current $V_{OC}$ between hot and neutral poles is measured, the load voltage $V_L$ between hot and neutral poles is measured while passing an electrical load current, and the voltage between isolated ground and neutral poles $V_{IGN}$ is measured while passing a test current between hot and ground poles, and expressing the voltage between isolated ground and neutral poles while said test current is passed divided by the difference between voltage without current and load voltage $V_{DROP}$, as a ratio $V_{IGN}/V_{DROP}$ indicative of neutral-ground faults. The isolated ground-neutral voltage $V_{IGN}$ is proportional to the isolated ground conductor impedance, the difference between voltage without current and load voltage $V_{DROP}$ is proportional to the hot-neutral loop impedance. The expected ratio is 0.5, with faults lowering impedance and ratio.

In a further broad aspect of the invention the method detects isolated ground-ground faults, wherein the voltage between neutral and isolated ground poles $V_{IGN}$ and the voltage between isolated ground and ground poles $V_{IGG}$ is measured while passing a test current from hot to isolated ground poles and expressing the isolated ground to ground voltage divided by the neutral to isolated ground voltage as a ratio $V_{IGG}/V_{IGN}$ indicative of isolated ground-ground faults. The expected ratio of isolated ground conductor impedance as measured from ground and neutral is 1, faults lower the ratio.

In a further broad aspect of the invention, the method detects isolated ground-ground faults wherein the voltage without current $V_{OC}$ between hot and neutral poles is measured, the load voltage $V_L$ between hot and neutral poles is measured while passing an electrical load current, and the voltage between hot and ground poles $V_{DRHG}$ is measured while passing a test current between hot and ground poles, and expressing the difference between the voltage without current and the voltage between hot and ground poles while said test current is passed $V_{DROPHG}=V_{OC}-V_{DRHG}$ divided by the difference between voltage without current and load voltage $V_{DROP}$, as a ratio $V_{DROPHG}/V_{DROP}$ indicative of isolated ground-ground faults. The hot-ground voltage drop $V_{DROPHG}$ is proportional to the hot-ground loop impedance. The expected ratio is 1, faults lower the ratio. The voltage without current $V_{OC}$ is the same for hot-neutral and hot-ground.

In a further broad aspect of the invention, the method detects isolated ground-ground faults wherein the voltage without current $V_{OC}$ between hot and neutral poles is measured, the load voltage $V_L$ between hot and neutral poles is measured while passing an electrical load current, and the voltage between hot and isolated ground poles $V_{DRHIG}$ is measured while passing a test current between hot and isolated ground poles, and expressing the difference between voltage without current and the voltage between hot and ground poles while said test current is passed, $V_{DROPHIG}=V_{OC}-V_{DRHIG}$ divided by the difference between voltage without current and load voltage $V_{DROP}$, as a ratio $V_{DROPHIG}/V_{DROP}$ indicative of isolated ground-ground faults. The hot-ground voltage $V_{DROPHIG}$ is proportional to the hot-ground loop impedance. The expected ratio is 1, faults lower the ratio. The voltage without current $V_{OC}$ is the same for hot-neutral and hot-isolated ground.

The ratios given above assume that the hot, neutral, ground and isolated ground conductors have the same impedance that is $Z_H=Z_N=Z_G=Z_{IG}$, which may not be the case, the normal ratios without a fault will be the same or similar for related circuits without fault and the ratio will be noticeably different when a fault is present.

Although the invention applies primarily to testing the more common alternating current circuits it is equally applicable to the less common direct current circuits.

When both isolated ground and ground are present the ground is normally attached directly to the receptacle box rather than to a receptacle pole. Under these circumstances, different adapters are required for the receptacle to measure neutral-ground or isolated ground-ground voltages. As those skilled in the art understand, only two out of three loops (neutral-ground, neutral-isolated ground, isolated ground-ground) or conductors (neutral, isolated ground, ground) need be tested under normal circumstances to detect faults.

With use of suitable adapters, to connect to neutral, ground, and isolated ground, all three loops and conductors can be readily tested for faults.

Figure 1:
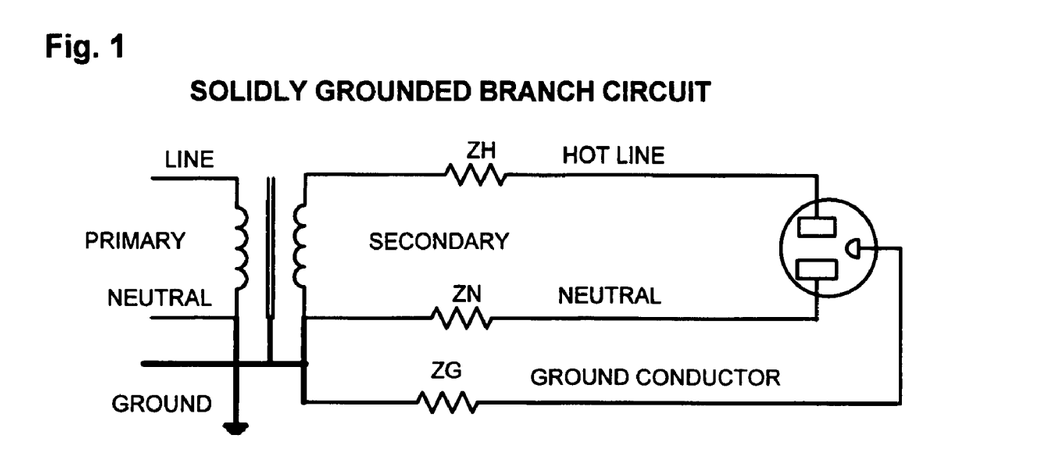
FIG. 1 shows a schematic of a solidly grounded branch circuit.
Figure 3:
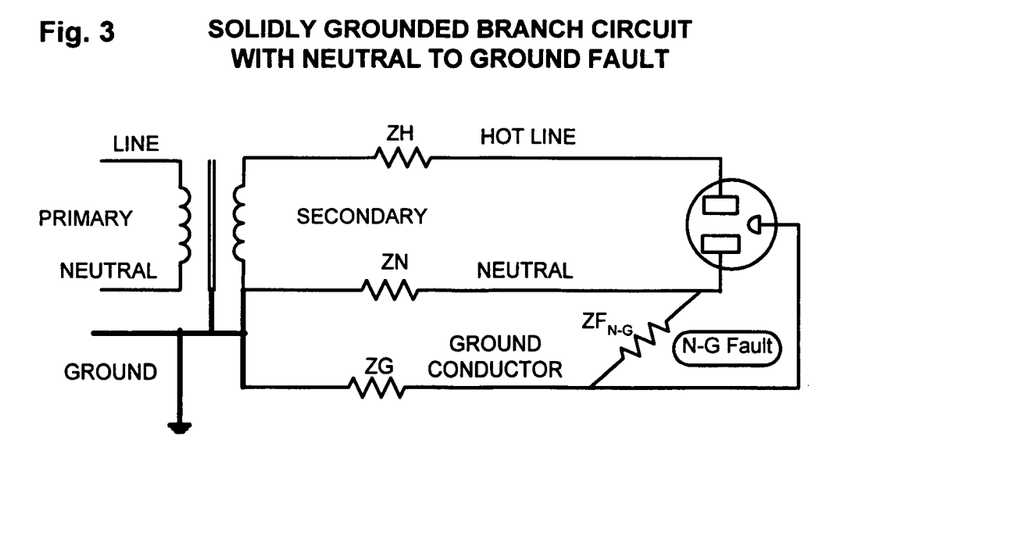
FIG. 3 shows a schematic of a solidly grounded branch circuit with a neutral-ground fault.

A first preferred method checks a solidly grounded live branch circuit as in FIGS. 1 and 3 for neutral-ground faults. Measurements are taken in no particular order. A known resistive load, strictly impedance, $Z_L$ is connected between the hot and neutral poles of a receptacle, or other type of outlet. A load current $I_L$ flows and is measured and stored. The hot-neutral voltage across the load is measured directly $V_L$ or calculated from $I_L*Z_L$, the neutral-ground voltage while the load current flows is also measured directly $V_{NG}$. The hot-neutral voltage $V_{OC}$ (voltage no current) is directly measured for the open circuit. $V_{DROP}=V_{OC}-V_L$ is then calculated and the ratio $\alpha=V_{NG}/V_{DROP}$ is then calculated and interpreted. This method is preferred because it is the simplest. By including the neutral conductor in both measurements under the same current, the method makes the determination dependent only on the actual characteristics of the circuit. It may be the most accurate method when measurement is automated to apply a pulsed load current of short duration—one or several half cycles of AC current—allowing all measurements to be made in a fraction of a second to minimize the interfering effects of changes in supply voltage or heating effects. This allows application of the method to already loaded circuits and circuits protected by GFCIs and GFIs, without actuating the protective device(s).

The circuit as shown in FIG. 1 has hot line impedance $Z_H$, neutral impedance $Z_N$, and ground impedance $Z_G$. As a first approximation in an ideal circuit these can be assumed to be equal. If there is no neutral-ground fault, then the impedance of the closed circuit with $Z_L$ is $Z_H+Z_L+Z_N$, so $V_{OC}=I_L*(Z_H+Z_L+Z_N)$ and $V_L=I_L*Z_L$. $V_{DROP}=V_{OC}-V_L=I_L*(Z_H+Z_N)$. Since there should be no current in the ground conductor then $V_{NG}=I_L*Z_N$. Thus ratio $\alpha=V_{NG}/V_{DROP}=Z_N/(Z_H+Z_N)$, or to a first approximation 0.5. For simplicity of calculation, impedances are treated as purely resistive. As those skilled in the art would realize on detailed numerical calculation this is indeed a rough approximation, since the impedances of hot, neutral and ground conductors need not be identical. For example hot impedance may well include significant source impedance, thus $Z_H$ may be more than $Z_N$ neutral impedance, typically of the order of up to about 10%, giving an $\alpha$ value of 0.47 or so. On the other hand $Z_N$ may be less than $Z_H$ when the neutral conductor is oversized to accommodate harmonics, typically of the order of up to about 20%, giving an $\alpha$ value of 0.44 or so. A combination of source impedance and oversized neutral conductor could give an $\alpha$ value of 0.42 or so. Additional source impedance due to transformer and circuit breakers in series with the hot line conductor could lower $\alpha$ under normal conditions to the order of 0.3 to 0.4. $Z_G$, ground impedance, may be much smaller than $Z_N$, neutral impedance, when the ground conductor is metallic conduit, typically found in normal industrial and institutional wiring. The value of the ratio $\alpha$ under "normal" conditions will differ depending on the characteristics of the type of circuits being tested. A significant difference in the value of the ratio $\alpha$ for a particular circuit compared to other circuits of the same type indicates a fault or other interfering circuit condition. When a neutral-ground fault, with impedance $ZF_{N-G}$, is introduced as shown in FIG. 3 (for convenience of calculation assumed to be at the outlet or receptacle). Then the effective impedance of the entire neutral-ground portion of the circuit is $Z_{NG}$, which is given by $1/Z_{NG}=(1/Z_N+1/(Z_G+ZF_{N-G}))$, a simplified ratio is $\alpha=((Z_N*ZF_{N-G})/(Z_N+Z_G+ZF_{N-G}))/(Z_H+((Z_N*(Z_G+ZF_{N-G}))/(Z_N+Z_G+ZF_{N-G})))$ Assuming $Z_H=Z_N=Z_G$ and $ZF_{N-G}=0.1Z_G$ we get $\alpha=((Z_H*0.1*Z_H)/(2.1*Z_H))/(Z_H+((Z_H*1.1*Z_H)/2.1*Z_H))$ which simplifies to $0.048*Z_H/1.52*Z_H=0.031$. If for example $ZF_{N-G}=Z_H$ then $\alpha$ simplifies to $0.33/1.67$ or 0.198. These ratios are theoretical estimates, and depend on the nature of the three conductors as well as the fault. The variable $V_{N-G}$ is the potential from the neutral of the receptacle or other outlet to where the fault joins the ground conductor, it is smaller than the potential from the neutral of the receptacle to the neutral-ground bond. Also, since the faulted neutral path to the neutral-ground bond has a lower impedance than the intact neutral conductor, the load current is greater. In the extreme case where the impedance $ZF_{N-G}$ is in the receptacle and is negligible, so is $V_{N-G}$ and thus the ratio. A rather more complicated ratio assuming $Z_H=Z_N=Z_G$ and $ZF_{N-G}=0.1Z_G$, gives an estimate for $\alpha$ of 0.094 for a fault 10% toward the ground-neutral bond, 0.152 for 20%, 0.207 for 30%, 0.277 for 40% and 0.308 for 50%. When there is a neutral-ground fault as in FIG. 3 and the circuit(s) is wired in conduit with a very low effective ground path impedance to the fault current then the value of $\alpha$ may drop to the order of 0.05. In formal calculations the measured $I_L$ is scaled to $I_S$ the standardized value of current for the circuit, generally 80% of rated capacity, usually 12 amps, $V_L$ and $V_{NG}$ are similarly scaled, and so is the calculated $V_{DROP}$, $V_{OC}$ itself is not scaled. $\alpha$ is calculated using the scaled values, which although not necessary mathematically, directly compare standardized currents and voltages to calculate $\alpha$.

A second preferred method checks a solidly grounded hot branch circuit as in FIGS. 1 and 3 for neutral-ground faults. Measurements are taken in no particular order. A known resistive load, strictly impedance, $Z_L$ is connected between the hot and neutral poles of a receptacle, or other type of outlet. A load current $I_L$ flows and is measured and stored. The hot-neutral voltage across the load $V_L$ is measured directly or calculated from $I_L*Z_L$. The hot-neutral voltage $V_{OC}$ (voltage no current) is directly measured for the open circuit. $V_{DROP}=V_{OC}-V_L$ is then calculated. An isolated voltage $V_{DRNG}$ is then connected across neutral and ground poles of the receptacle and the current $I_T$ in the neutral-ground circuit loop is then measured. The ratio $\beta=V_{DRNG}/V_{DROP}$ is then calculated, here measured $I_L$ and $I_T$ are scaled to $I_S$ the standardized value of current for the circuit, generally 80% of rated capacity, usually 12 amps, as are $V_L$, $V_{DRNG}$, and $V_{DROP}$. $V_{OC}$ is not scaled. $V_{DRNG}$ is proportionate to the impedance of the neutral-ground circuit loop, which in the absence of a neutral-ground fault is $Z_N+Z_G$, $V_{DROP}$ is proportionate to $Z_H+Z_N$, again in the absence of a neutral-ground fault. Technically $\beta=(V_{DRNG}*I_S/I_T)/((V_{OC}-V_L)*I_S/I_L)$. In an ideal circuit $Z_H=Z_N=Z_G$ then $\beta=1$. But as noted previously; $Z_H$ is often enhanced by additional source, transformer and circuit breaker impedances in series with the hot line conductor; $Z_N$ is often reduced by the larger neutral conductors needed to carry harmonic currents; and $Z_G$ may consist of a metallic conduit of small impedance. $\beta$ may therefore approximate to $Z_N/(Z_H+Z_N)$ perhaps as low as the order of 0.25 to 0.33 under these circumstances. When a neutral-ground fault as in FIG. 3 is present $V_{DROP}$ is proportionate to $Z_H+Z_G$, where $Z_G$ is small, $V_{DRNG}$ is proportionate to $Z_{NG}$ which may approximate to $ZF_{N-G}$ (fault impedance) and $\beta$ to $ZF_{N-G}/(Z_H+Z_G)$ which can be expected to be less than 0.2 or even 0.01.

The above methods are primarily appropriate to test new installation without existing loads. Circuits tested with existing loads may have modified ratios $\alpha$ (and $\beta$).

These ratios $\alpha$, and $\beta$, are quite different between an intact circuit and a circuit with a fault. They do however vary significantly, depending on the type of circuit itself, and are most accurate for newly installed circuits without existing loads.

Shared neutrals from several single phase circuits, so that the current in the neutral conductor is the sum of the currents in each circuit, will affect the measurements. Here $V_{NG}$ is increased due to the voltage drop produced being larger because of the additional current, when the two circuits have the same source phase. Here α is increased over the value shown by the applied test load current $I_L$ alone, and may be from 0.5 to 0.75 as opposed to 0.3 to 0.4 when only the single circuit test load current is flowing. When the neutral conductor is shared by circuits derived from opposite phases of the supply (as in North American 240/120 volt supply systems), then the effect is the opposite of that when both circuits are the same phase, and the value of α may be less, perhaps about 0.2 when transformer and breaker impedance are taken into consideration. Another possibility is shared three phase circuits with unbalanced phase currents, the neutral feeder will have a current flowing in it that acts as a shared neutral.

Similar effects are produced when the neutral conductor is undersized compared to the hot conductor, or has high resistance at a loose connection and thus greater impedance $Z_N$, producing a higher value of α, demonstrating either a high impedance neutral conductor or shared neutral with additional in-phase load currents flowing in the neutral conductor. If the neutral is oversized compared to the phase conductor and its impedance $Z_N$ is less, or if the neutral is shared between circuits of opposite (or different) phases, then the value of α is reduced. The value of α may be used to detect these conditions as well as a neutral ground fault condition.

It is possible to correct α under these conditions by measuring $V_{NGNL}$, the neutral ground voltage with no test load current, and subtracting it from the measured test voltage $V_{NG}$, to give $\alpha=(V_{NG}-V_{NGNL})/(V_{NL}-V_L)$, which should approximate to the "normal" value of α.

A third less quantitative method is to apply a normal load current deriving standardized $I_L$ and $V_L$, while at the same time measuring the voltage between the ground pole and a reference ground point, an unconnected independent reference ground $V_{GR}$, and the voltage between the neutral pole and an unconnected independent reference ground $V_{NR}$. The ratio $V_{GR}/V_{NR}$ in the absence of a fault should be zero, as should $V_{GR}$ as this voltage is that of the ground to neutral bond and should approximate to zero. In the presence of a fault it should approximate to the voltage between fault and ground neutral bond, which is greater than zero, indicating a voltage and hence a current and a fault in the ground circuit and thus a ground-neutral fault. While the absolute differences is indicative only, the observed ratio between the independent reference ground-ground or independent reference ground-isolated ground and neutral-ground voltages is more precise as an indicator.

The observed values of ratios α and β are determined by circuit wiring method, and thus can have wide range between different circuit types with different characteristics. The location of faults relative to the test and source points of the circuit also affect the α and β ratios. Within a particular type of circuit and installation, the circuit characteristics and so the normal ratios are quite uniform.

Generally one performs a series of tests on a representative sample of outlets to determine the representative range of normal values of the ratio of the type of circuit in the area, (one must watch for faulty circuits with abnormal ratio values). Then a circuit with a significantly different ratio from the representative values indicates a non-normal circuit condition (typically a fault or shared neutral conductor). When only major faults require identification, a range of ratio values can be defined as normal, and only those ratio values falling outside the range are considered "abnormal".

Isolated ground conductors as well as ground conductors are present in many circuits. The methods outlined above can be used to test for isolated ground-neutral faults. It should be noted that the ground conductor and isolated ground conductors may have identical or very different characteristics. That is the ratios α, and β may be quite different for an isolated ground conductor and a ground conductor in the same circuit.

Figure 2:
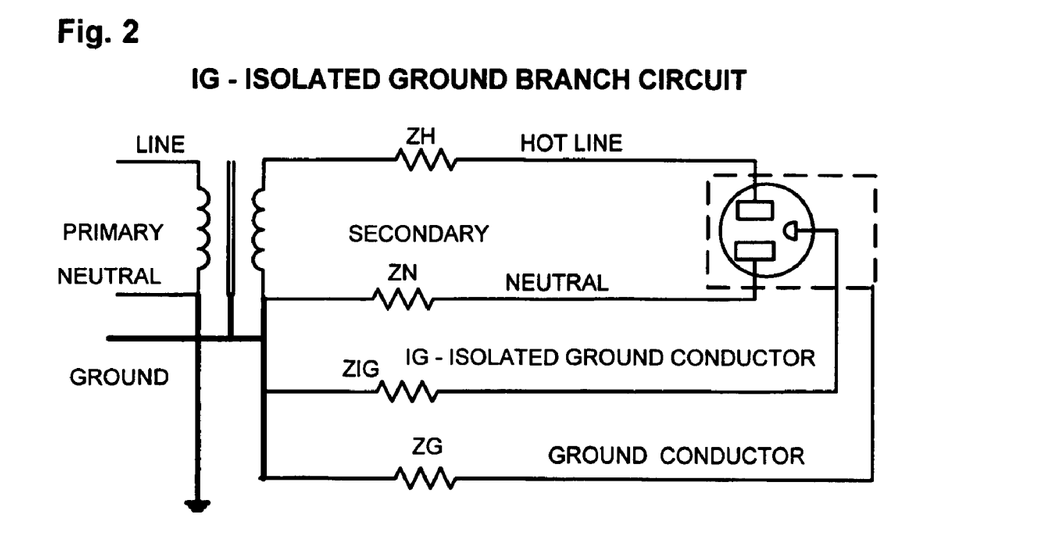
FIG. 2 shows a schematic of an isolated ground branch circuit.
Figure 4:
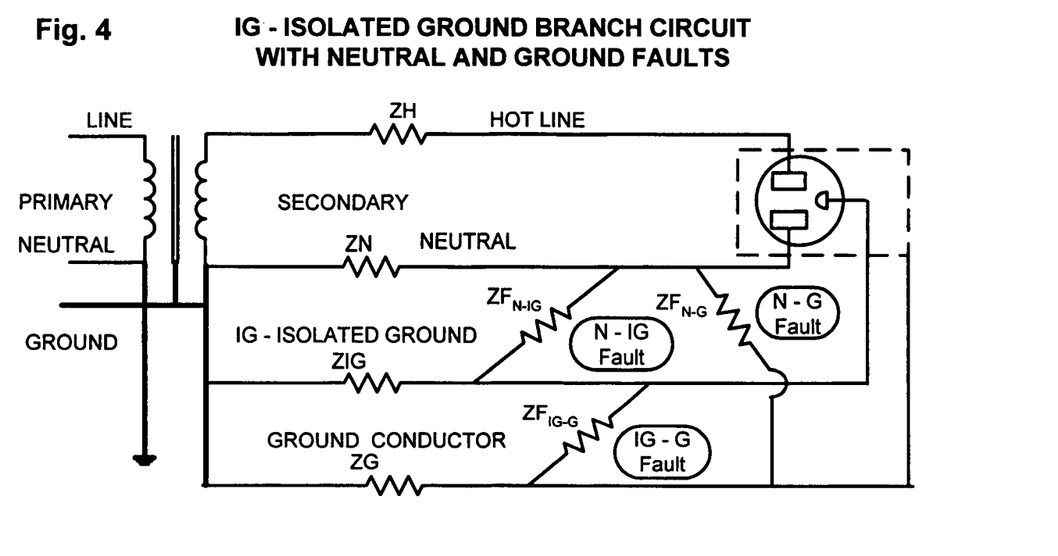
FIG. 4 shows a schematic of an isolated ground branch circuit with neutral-ground, neutral-isolated ground and isolated ground-ground faults.

As shown in FIGS. 2 and 4, an isolated ground branch circuit consists of four conductors, hot with impedance $Z_H$, neutral with impedance $Z_N$, ground with impedance $Z_G$, and isolated ground with impedance $Z_{IG}$. As shown in FIG. 4, the neutral ground fault has an impedance of $ZF_{N-G}$, the neutral isolated ground fault has an impedance of $ZF_{N-IG}$, the isolated ground-ground fault has an impedance of $ZF_{IG-G}$. There are two methods of testing the circuits for faults.

The fourth method involves testing the neutral-ground circuit and separately the neutral-isolated ground circuit for faults as indicated earlier for neutral-ground circuits without an isolated ground. Any of the four methods may be used but the preferred version is to measure for the neutral-ground circuit; $Z_L$, a known resistive load applied across hot and neutral poles of the outlet, $I_L$ is the measured load current, $V_L$ is either the calculated voltage $Z_L*I_L$, or the directly measured voltage $V_L$, $V_{NG}$ the neutral-ground voltage is measured at the same time, $V_{OC}$, the neutral-hot voltage without current is then measured. $I_L$ is scaled to $I_S$, similarly $V_L$ and $V_{NG}$ are scaled, $V_{DROP}$ that is $V_{OC}-V_L$ is calculated as is $\alpha_G=V_{NG}/V_{DROP}$, to identify the presence of a neutral-ground fault. Similarly $Z_L$, $I_L$, $V_L$, $V_{OC}$, and $V_{NIG}$, the voltage across the neutral and isolated ground poles of the outlet are measured, $I_L$ is scaled to $I_S$ are $V_L$ and $V_{NIG}$, $V_{DROP}$ is calculated as is $\alpha_{IG}=V_{NIG}/V_{DROP}$, to identify a neutral-isolated ground fault. $V_{OC}$ is not scaled. Then, when the absence of neutral-ground and neutral-isolated ground faults is determined, an external isolated low voltage source is applied across the neutral and isolated ground poles of the outlet, that is through the neutral to isolated ground circuit loop. A test current $I_{TNIG}$ is applied and measured across the neutral and isolated ground poles, and the driving voltage $V_{DRNIG}$ measured which is proportional to the impedance of the circuit loop, $Z_N+Z_{IG}$, the current and voltage are corrected to a standardized value of test current for the circuit. A test current $I_{TIGG}$ is then applied and measured across the isolated ground and ground poles of the outlet, and the driving voltage $V_{DRIGG}$ measured which is proportional to the impedance of the isolated ground to ground loop, $Z_{IG}+Z_G$, the current and voltage are then corrected to a standardized value of test current for the circuit. Then ratio $\phi=V_{DRIGG}/V_{DRNIG}$ This value φ theoretically equals $(Z_G+Z_{IG})/(Z_N+Z_{IG})$, which if $Z_H=Z_N=Z_{IG}=Z_G$, should be 1. As noted earlier this is often not the case. If there is an improper connection between isolated ground and ground at the receptacle or outlet such that $ZF_{IG-G}=0.1$, then φ is much less than 1. In general any value of φ less than 1 indicates an improper connection between isolated ground and ground. As noted earlier the neutral conductor may be oversized and have lower $Z_N$, while oversized ground, such as wired in conduit may have $Z_G=0.1Z_{IG}$, in this case a normal ratio φ would be less than 1. In other words interpretation of the ratio is required. As these measurements are taken at different times, the test currents may be pulsed or modulated to enhance measurement in the case of interfering signal produced by other currents on the electrical system, or repeated measurements may be made to reduce the effect of system voltage instability. The measurements may be made manually or automatically or by a combination of manual and automatic methods.

A fifth alternative method involves connecting a load and current across hot and neutral then across hot and isolated ground and last across hot and ground and in each case measuring the voltage differences between hot, neutral, ground and isolated ground. In general $V_{DROP}=V_{OC}-V_L$, the difference between hot-neutral voltage without current and hot-neutral voltage with load current, $V_{DROPHG}$ the difference between hot-neutral voltage without current and hot-ground voltage with load current, and $V_{DROPHIG}$ the difference between hot-neutral voltage without current and hot-isolated ground voltage with load current are compared as ratios to detect neutral-ground and neutral-isolated ground faults.

In general fault free circuits of the same type have much the same ratios, and circuits with faults have different ratios, allowing identification by unusual signature. Although different types of circuits have different ratios, for instance ones with shared neutrals, these circuits are easily identifiable by their ratios as are circuits with faults.

Ratios of other pertinent circuit electrical characteristics may also be used in a similar manner to determine the integrity of the circuit or to detect faults. Other equivalent circuit measurements may also be utilized by those skilled in the art to determine the circuit parameters for use with this method.

DESCRIPTION OF THE PREFERRED EMBODIMENTS

Figure 5:
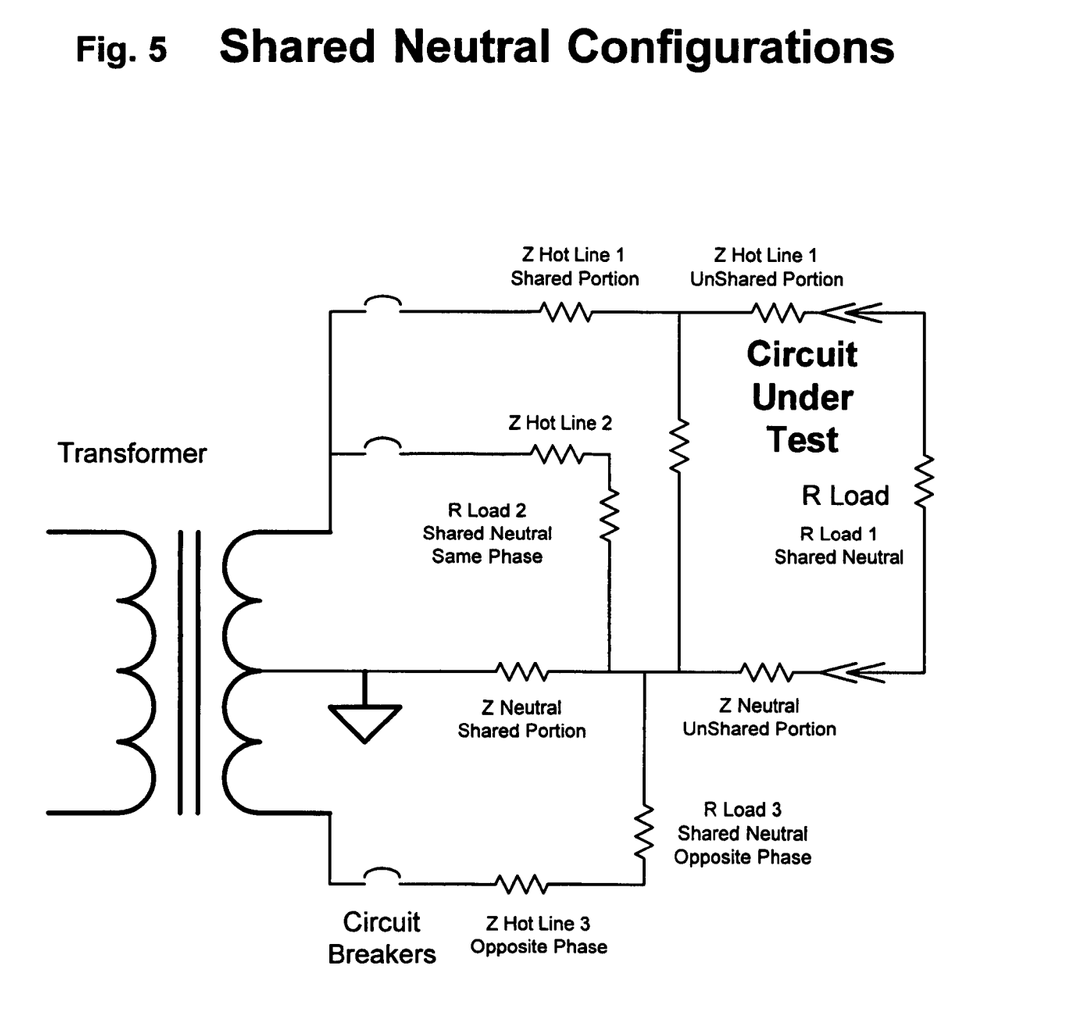
FIG. 5 shows a schematic of interconnected opposed phase and same phase circuits with a common neutral conductor.
Figure 6:
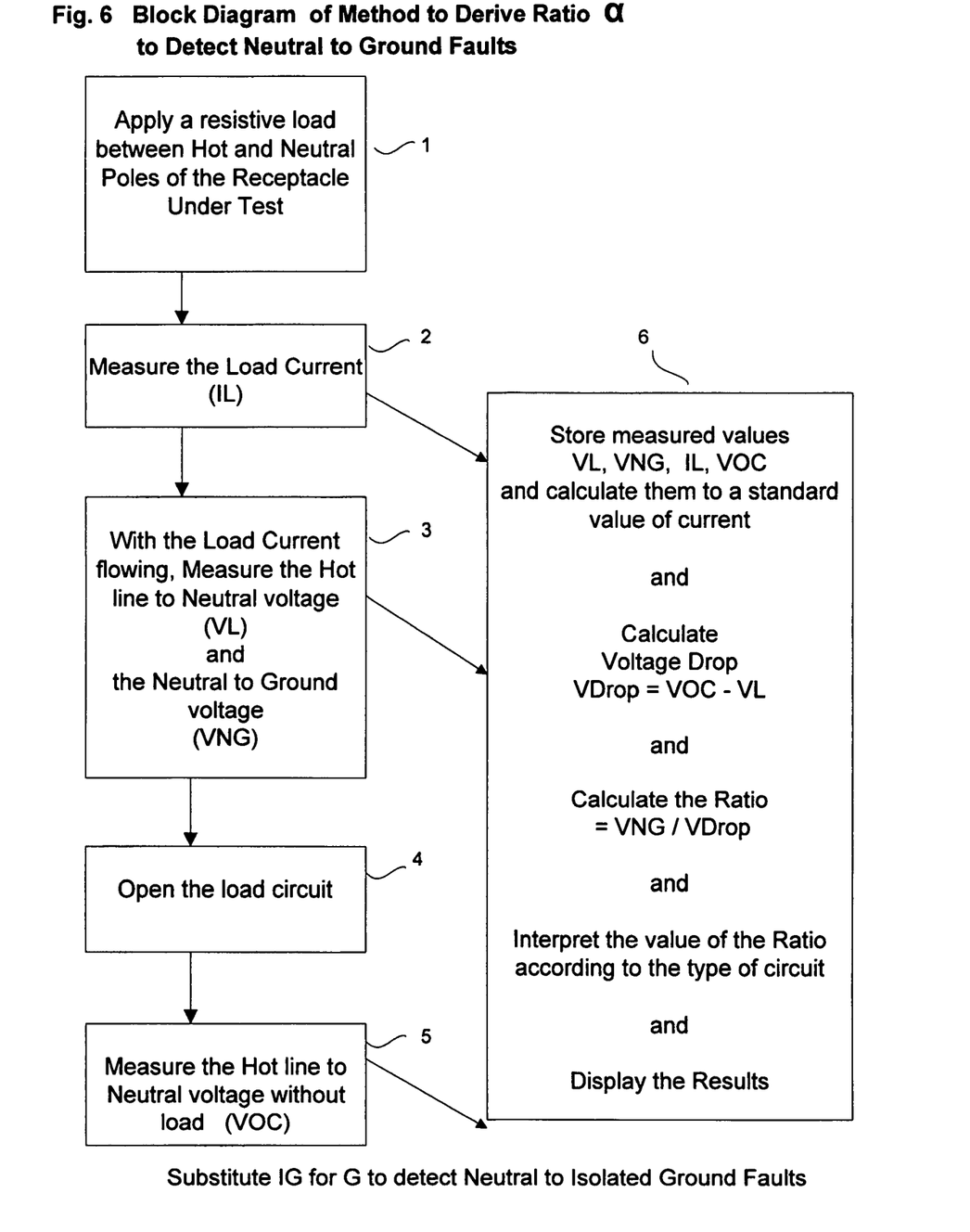
FIG. 6 shows a block diagram of a method of testing for neutral ground faults of the invention.

As noted previously FIGS. 1 to 4 show simple three and four conductor circuits with and without faults, while FIG. 5 shows a common single phase circuit, with three hot and one neutral conductors. FIG. 6 shows a six step method of deriving ratio α, note that step 1 applies a resistive load between hot and neutral poles of the receptacle under test, step 2 measures the load current $I_L$, with the load current flowing step 3 measures the hot-neutral voltage $V_L$, and neutral to ground voltage $V_{NG}$, then step 4 the load circuit is opened and step 5 the hot to neutral voltage without current $V_{OC}$ is measured, (note that $V_{OC}$ can also be measured initially), step 6 takes the stored values of $I_L, V_L, V_{NG}$, scales them to standard current for the circuit $I_S$, calculates the voltage drop $V_{DROP}=V_{OC}-V_L$, and then the ratio $\alpha=V_{NG}/V_{DROP}$ which can be displayed and interpreted according to circuit type. $V_{OC}$ is not scaled. The ground conductor tested can be an isolated ground conductor, in which case neutral to ground voltage is $V_{NIG}$ and $\alpha=V_{NIG}/V_{DROP}$.

Figure 7:
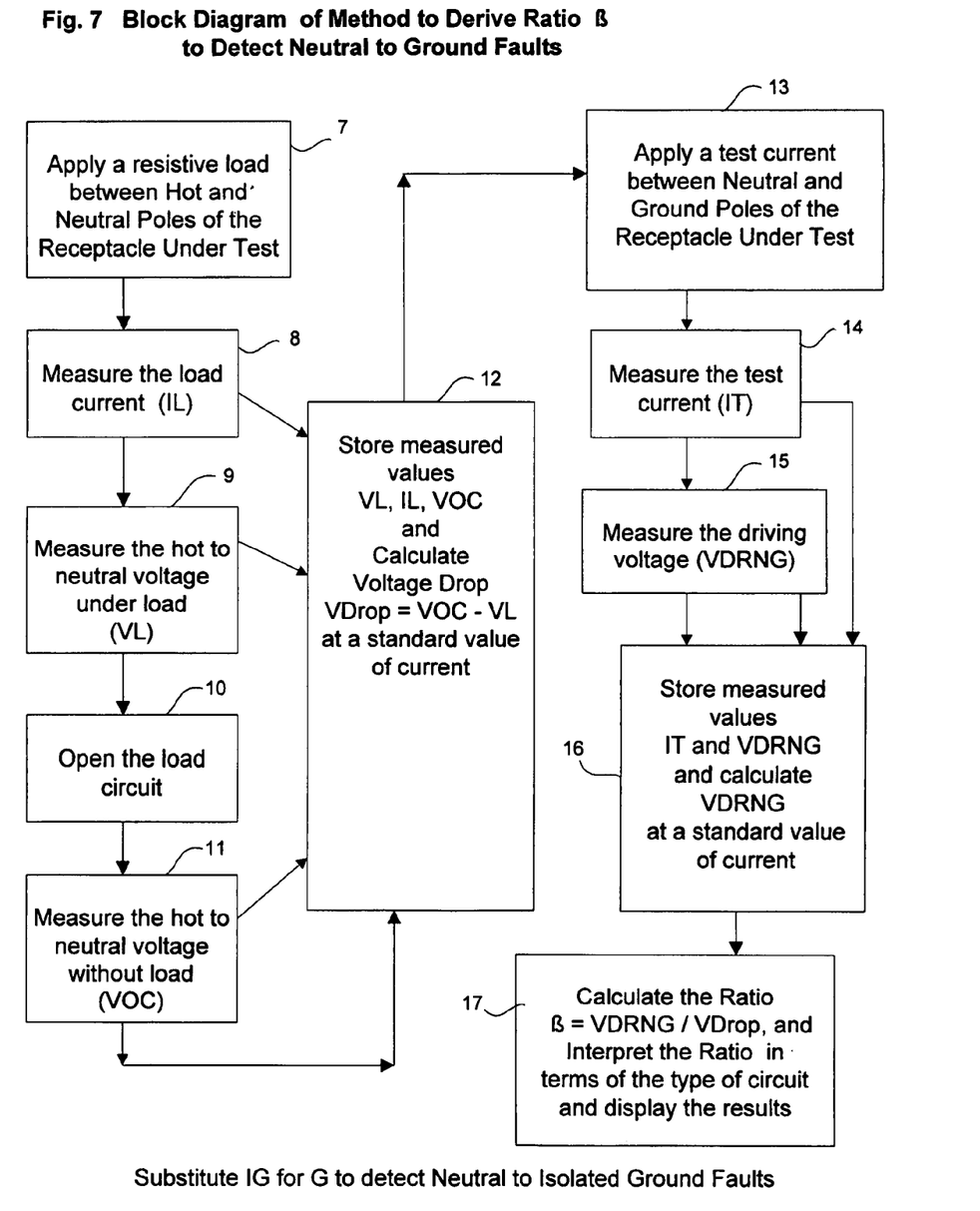
FIG. 7 shows a block diagram of a second method of testing for neutral ground faults of the invention.

FIG. 7 shows an eleven step method to derive ratio β, step 7 applies a resistive load between hot and neutral poles of the receptacle under test, step 8 measures the load current $I_L$, with the load current flowing step 9 measures the hot-neutral voltage $V_L$, then step 10 the load circuit is opened, and step 11 the hot to neutral voltage without current $V_{OC}$ is measured, step 12 takes the stored values of $I_L, V_L$, scales them to standard current for the circuit $I_S$, step 13 applies a test current between neutral and ground poles of the receptacle, step 14 measures the test current $I_T$, step 15 measures the driving voltage $V_{DRNG}$, step 16 stores measured values $I_T$ and $V_{DRNG}$ and scales $V_{DRNG}$ to a standard current for the circuit, step 17 calculates $\beta=V_{DRNG}/V_{DROP}$ which can be displayed and interpreted according to circuit type. This method can also be applied to an isolated ground pole outlet.

Figure 8:
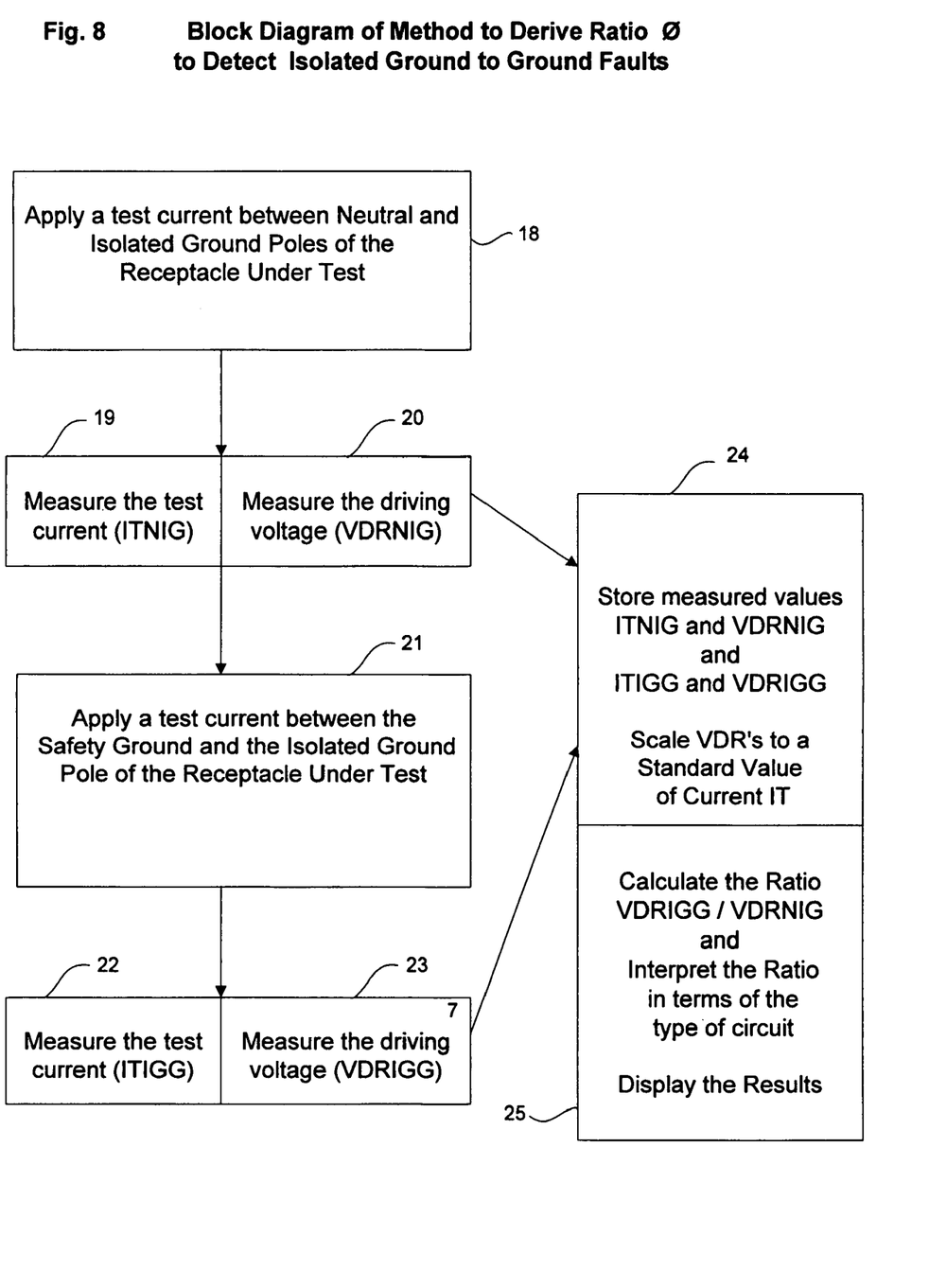
FIG. 8 shows a block diagram of a method of testing for isolated ground-ground faults of the invention.

FIG. 8 shows an eight step method for checking for isolated ground-ground faults. Before applying this test the system is tested for neutral ground and neutral isolated ground faults, step 18 applies a test current between neutral and isolated ground step 19 measures the test current $I_{TNIG}$, step 20 measures the driving voltage $V_{DRNIG}$, step 21 applies a test current between the (safety) ground and the isolated ground, step 22 measures the test current $I_{TIGG}$, step 23 measures the driving voltage $V_{DRIGG}$, step 24 stores the values of $I_{TNIG}, V_{DRNIG}, I_{TIGG}, V_{DRIGG}$ and scales them to the standard current for the circuit, step 25 calculates and the ratio $\phi=V_{DRIGG}/V_{DRNIG}$ and displays the results.

Test results are given in table II.

TABLE II

| Receptacle | $I_L$ | $V_L$ | $V_{OC}$ | $V_{NG}$ | $I_T$ | $V_{DR}$ % at 12 A | $V_{DROP}$ | α | β | |
|---|---|---|---|---|---|---|---|---|---|---|
| SOLIDLY GROUNDED CIRCUITS IN CONDUIT - WITH LOW SOURCE IMPEDANCE | | | | | | | | | | |
| 1X-06A | 11.5 | 121.7 | 122.8 | 0.5 | 12.0 | 0.8 | 0.9 | 0.47 | 0.73 | |
| 1X-06B | 11.5 | 122.1 | 123.4 | 0.5 | 12.0 | 0.8 | 1.1 | 0.40 | 0.62 | |
| 1X-07A | 11.6 | 122.5 | 123.8 | 0.6 | 12.0 | 0.9 | 1.1 | 0.43 | 0.64 | |
| 1X-07B | 11.6 | 122.5 | 123.9 | 0.6 | 12.0 | 0.9 | 1.2 | 0.40 | 0.59 | |
| 1X-33A | 11.5 | 122.0 | 123.4 | 0.6 | 12.0 | 0.9 | 1.2 | 0.40 | 0.62 | |
| 1X-33A | 11.5 | 121.8 | 123.1 | 0.6 | 12.0 | 0.9 | 1.1 | 0.43 | 0.67 | |
| 1X-33B | 11.6 | 121.9 | 123.3 | 0.6 | 11.0 | 0.9 | 1.2 | 0.40 | 0.68 | |
| 1X-33B | 11.5 | 121.9 | 123.2 | 0.6 | 12.0 | 0.9 | 1.1 | 0.43 | 0.66 | |
| E1X-03A | 11.5 | 121.9 | 123.3 | 0.6 | 11.8 | 1.0 | 1.2 | 0.43 | 0.71 | |
| E1X-03B | 11.5 | 121.8 | 123.3 | 0.6 | 11.8 | 1.0 | 1.3 | 0.40 | 0.66 | |
| E1B-15 | 11.5 | 122.3 | 123.7 | 0.5 | 12.0 | 0.9 | 1.2 | 0.39 | 0.59 | |
| 1S-30B | 11.3 | 119.3 | 121.5 | 1.0 | 11.0 | 1.3 | 1.9 | 0.46 | 0.61 | |
| 1S-30B | 11.3 | 119.7 | 121.8 | 1.0 | 11.0 | 1.3 | 1.8 | 0.48 | 0.64 | |
| CIRCUITS WITH N-G Faults | | | | | | | | | | |
| E2C-15B | 11.5 | 121.7 | 123.2 | 0.7 | 11.5 | 1.1 | 1.3 | 0.46 | 0.72 | normal |
| E2C-15B | 11.6 | 121.8 | 123.2 | 0.1 | 12.7 | 0.2 | 1.2 | 0.08 | 0.13 | fault 1 |
| E2C-15B | 11.6 | 121.9 | 123.1 | 0.2 | 12.5 | 0.4 | 1.0 | 0.18 | 0.28 | fault 2 |
| E2D-09A | 11.5 | 121.8 | 123.3 | 0.1 | 12.7 | 0.1 | 1.3 | 0.06 | 0.09 | fault |
| E2D-09A | 11.5 | 120.9 | 123.1 | 1.0 | 11.3 | 1.3 | 1.9 | 0.45 | 0.60 | repaired |
| E2D-09B | 11.5 | 121.8 | 123.2 | 0.2 | 12.6 | 0.1 | 1.2 | 0.11 | 0.15 | fault |
| E1E-01 | 11.5 | 121.1 | 122.5 | 0.1 | 12.8 | 0.1 | 1.2 | 0.08 | 0.13 | fault |
| E1E-01 | 11.5 | 121.7 | 123.6 | 0.9 | 11.5 | 1.2 | 1.6 | 0.46 | 0.62 | repaired |
| UPS CIRCUITS WITH HIGHER SOURCE IMPEDANCE | | | | | | | | | | |
| UPS-EC-01 | 11.0 | 117.2 | 121.1 | 0.4 | 12.0 | 0.8 | 3.5 | 0.11 | 0.18 | normal |
| UPS-EF-30 | 11.0 | 116.6 | 120.8 | 0.6 | 11.0 | 0.9 | 3.8 | 0.14 | 0.21 | normal |
| UPS-EF-05 | 11.0 | 116.6 | 121.4 | 0.9 | 10.6 | 1.3 | 4.3 | 0.19 | 0.27 | normal |

TABLE II-continued

| Receptacle | $I_L$ | $V_L$ | $V_{OC}$ | $V_{NG}$ | $I_T$ | $V_{DR}$ % at 12 A | $V_{DROP}$ | α | β | |
|---|---|---|---|---|---|---|---|---|---|---|
| UPS-EF-05 | 11.0 | 117.1 | 121.5 | 0.2 | 12.0 | 0.3 | 4.0 | 0.05 | 0.07 | fault 1 |
| UPS-EF-05 | 11.0 | 116.6 | 121.5 | 0.9 | 10.0 | 1.2 | 4.4 | 0.18 | 0.26 | fault 2 |
| SOLIDLY GROUNDED FAULTS IN BX CABLE WITH REMOTE NAIL PUNCTURES AND OTHER N-G FAULTS | | | | | | | | | | |
| B2-41A | 11.7 | 120.8 | 122 | — | 12 | 0.136 | 1.01 | — | 0.11 | fault |
| B2-41A | 11.9 | 122 | 123.9 | — | 12 | 1.219 | 1.55 | — | 0.64 | repaired |
| C1-39 | 11.6 | 119.5 | 121.5 | — | 12 | 0.643 | 1.70 | — | 0.31 | fault |
| C1-39 | 11.5 | 120.8 | 123.2 | — | 12.2 | 1.6 | 2.03 | — | 0.63 | repaired |
| D2-20A | 11.8 | 120.5 | 122.6 | — | 12 | 0.641 | 1.74 | — | 0.30 | fault |
| D2-20A | 11.8 | 120.7 | 122.6 | — | 12 | 1.643 | 1.58 | — | 0.85 | repair |
| D1-26 | 11.6 | 118.8 | 121.5 | — | 12 | 0.796 | 2.30 | — | 0.28 | fault |
| D1-26 | 11.8 | 120.3 | 123 | — | 12 | 2.47 | 2.23 | — | 0.90 | repaired |
| E2-17 | 11.8 | 120.4 | 122.1 | — | 12 | 0.305 | 1.42 | — | 0.18 | fault |
| E2-17 | 11.8 | 120.2 | 122.1 | — | 12 | 1.486 | 1.58 | — | 0.77 | repaired |
| E1-20A | 11.8 | 120.5 | 122.4 | — | 12 | 0.456 | 1.58 | — | 0.24 | fault |
| E1-20A | 11.8 | 120.6 | 122.9 | — | 12 | 1.85 | 1.95 | — | 0.77 | repair |
| E1-20B | 11.8 | 120.2 | 122.9 | — | 12 | 0.883 | 1.83 | — | 0.39 | fault |
| E1-20B | 11.5 | 120.9 | 123.2 | — | 12.2 | 1.7 | 1.95 | — | 0.70 | repair |

Notes on Table II

The receptacle code refers to circuit and receptacle. E2C-15B, fault 1 was a N-G short imposed at the receptacle, fault 2 was a N-G short imposed in circuit E2C-15 five feet away. E2D-09A fault was knockout neutral contact. E2D-09B detected the fault in E2D-09A. UPS-EF-05 fault 1 was a N-G short imposed at the receptacle, fault condition 2 was a N-G fault in UPS-EF-06, with no effect on UPS-EF-05. B2-41A, C1-39, D2-20A, D1-26, E1-20A, were detected preexisting N-G faults. E1-20B detected the fault in E1-20A in the same circuit at E1-20A, and the repaired condition of E1-20B is after the repair of E1-20A. E2-17 the fault was a N-G fault in the same circuit in the next room. It was concluded from these results that the ratios α and β were satisfactory in detecting N-G faults in a variety of live circuits, even though these ratios, α and β vary between circuits and types of circuits.

In practice most circuits are more or less intact, and while the ratios vary widely by circuit type, it is very easy to detect faulty circuits by comparison. It is also possible to detect multiple faults within one circuit.

As those skilled in the art would recognize, the order of making the measurements may be varied to effect the same result. The measurements and the resultant ratios may be similarly varied to effect the same or similar results.

As those skilled in the art would realize these preferred described steps and methods can be subjected to substantial variation, modification, change, alteration, and substitution without affecting or modifying the function of the described embodiments.

Although embodiments of the invention have been described above, it is not limited thereto, and it will be apparent to persons skilled in the art that numerous modifications and variations form part of the present invention insofar as they do not depart from the spirit, nature and scope of the claimed and described invention.

I claim:

1. Method for detecting ground-neutral faults in live alternating current circuits by comparing voltage drops across portions of the circuit, and expressing ratios of these voltage drops as indicative of faults,
   wherein said voltage drops are compared by passing electric currents between receptacle poles and measuring voltage drops caused by said electric currents wherein the voltage without current between the hot and neutral poles is measured, the load voltage between the hot and neutral poles is measured while passing an electrical load current, and the voltage between neutral and ground poles caused by said electrical load current is measured and expressing the neutral-ground voltage divided by the difference between the voltage without current and the load voltage as a ratio indicative of neutral-ground faults.

2. Method for detecting neutral-ground faults in live alternating current circuits by comparing voltage drops across portions of the circuit, and expressing ratios of these voltage drops as indicative of faults,
   wherein said voltage drops are compared by passing electric currents between receptacle poles and measuring voltage drops caused by said electric currents wherein the voltage without current between the hot and neutral poles is measured, the load voltage between the hot and neutral poles is measured while passing an electrical load current, and the driving voltage to produce a test current between neutral and ground poles is measured, and expressing the neutral to ground driving voltage divided by the difference between the voltage without current and the load voltage as a ratio indicative of neutral-ground faults.

3. Method for detecting neutral-ground faults in live alternating current circuits by comparing voltage drops across portions of the circuit, and expressing ratios of these voltage drops as indicative of faults,
   wherein said voltage drops are compared by passing electric currents between receptacle poles and measuring voltage drops caused by said electric currents wherein the voltage without current between hot and neutral poles is measured, the load voltage between hot and neutral poles is measured while passing an electrical load current, and the voltage between ground and neutral poles is measured while passing a test current between hot and ground poles, and expressing the voltage between ground and neutral poles while said test current is passed divided by the difference between voltage without current and load voltage, as a ratio indicative of neutral-ground faults.

* * * * *